(12) United States Patent
Dunham et al.

(10) Patent No.: US 12,241,689 B2
(45) Date of Patent: Mar. 4, 2025

(54) HEAT TRANSFER ELEMENT

(71) Applicant: Analog Devices, Inc., Norwood, MA (US)

(72) Inventors: Marc T. Dunham, Foster City, CA (US); Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 161 days.

(21) Appl. No.: 16/777,654

(22) Filed: Jan. 30, 2020

(65) Prior Publication Data
US 2021/0239405 A1    Aug. 5, 2021

(51) Int. Cl.
*F28D 15/02*      (2006.01)
*F28F 21/08*      (2006.01)
*H05K 7/20*       (2006.01)

(52) U.S. Cl.
CPC ..... *F28D 15/0275* (2013.01); *F28D 15/0233* (2013.01); *F28F 21/084* (2013.01); *F28F 21/087* (2013.01); *F28F 21/089* (2013.01); *H05K 7/20336* (2013.01); *F28F 2280/00* (2013.01)

(58) Field of Classification Search
CPC .............. F28D 15/0275; F28D 15/0233; F28F 21/089; H05K 7/20336
See application file for complete search history.

(56) References Cited

U.S. PATENT DOCUMENTS

| | | | |
|---|---|---|---|
| 6,586,279 B1* | 7/2003 | Davidson | H01L 23/3736 257/E23.109 |
| 7,561,425 B2* | 7/2009 | Mindock | H01L 23/427 174/15.1 |
| 8,703,286 B2* | 4/2014 | Jayaraman | H01L 23/4275 428/323 |
| 9,147,665 B2* | 9/2015 | Zhu | H01L 23/49513 |
| 9,288,930 B2 | 3/2016 | Kim et al. | |
| 9,795,059 B2* | 10/2017 | Strader | B22F 7/04 |
| 10,685,854 B2* | 6/2020 | Hung | H01L 23/34 |
| 2003/0168731 A1* | 9/2003 | Matayabas, Jr. | H01L 24/29 257/712 |
| 2006/0016578 A1* | 1/2006 | Huang | F28D 15/0233 257/E23.088 |
| 2009/0056917 A1* | 3/2009 | Majumdar | F28D 15/046 165/104.26 |
| 2014/0030575 A1 | 1/2014 | Kim et al. | |
| 2014/0190543 A1* | 7/2014 | Chen | H10N 19/00 136/224 |

(Continued)

FOREIGN PATENT DOCUMENTS

WO    WO 2011/040313 A1    4/2011

*Primary Examiner* — Claire E Rojohn, III
(74) *Attorney, Agent, or Firm* — Knobbe, Martens, Olson & Bear, LLP

(57) ABSTRACT

A heat transfer element is disclosed. The heat transfer element can be configured to directly bond to a metal surface of an element. The heat transfer element can include a chamber that is defined at least in part by a housing that has a metal portion. The heat transfer element can also include a phase change material disposed in the chamber. The phase change material can be in thermal communication with the metal portion. The Heat transfer element can be bonded to the element to define a bonded structure.

7 Claims, 7 Drawing Sheets

(56) References Cited

U.S. PATENT DOCUMENTS

| | | | |
|---|---|---|---|
| 2015/0327397 A1* | 11/2015 | Murayama | H05K 7/2039 |
| | | | 165/185 |
| 2016/0064637 A1* | 3/2016 | Cornett | H10N 10/17 |
| | | | 136/212 |
| 2019/0039883 A1* | 2/2019 | Chen | B81B 7/0093 |
| 2021/0065955 A1* | 3/2021 | Lambkin | H01L 23/53295 |
| 2021/0239405 A1* | 8/2021 | Dunham | F28F 21/089 |
| 2021/0249185 A1* | 8/2021 | McGuinness | H01G 4/30 |

\* cited by examiner

HEAT TRANSFER ELEMENT

BACKGROUND

Field of the Invention

The field relates to a heat transfer element for an integrated device package, and in particular, to an integrated device package that includes a phase change material for heat transfer.

Description of the Related Art

An integrated device package can include electrical components (e.g., integrated device dies, passive components such as inductors, resistors, and capacitors, etc.). Some electrical components generate heat during operation. It can be important to transfer the generated heat out of the package during operation. Accordingly, there remains a continuing need for improved heat transfer elements for integrated device packages.

SUMMARY OF THE INVENTION

For purposes of summarizing the disclosure, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

In one aspect, a bonded structure is disclosed. The bonded structure includes a housing that defines a chamber, a phase change material that is disposed in the chamber, and an element that is bonded to the housing by way of a metal bonding structure. The phase change material is in thermal communication with a first side of the metal bonding structure. The element is in communication with a second side of the metal bonding structure.

In one embodiment, the metal bonding structure is a reactive metal bonding structure.

In one embodiment, the metal bonding structure covers more than fifty percent of a bottom surface of the housing.

In one embodiment, the phase change material and the first side of the metal bonding structure are in direct contact.

In one embodiment, the housing comprises a non-conductive frame that includes a base and a wall extending from the base. The non-conductive frame can include a first side that is in contact with the first side of the metal bonding structure and a second side opposite the first side of the non-conductive frame. The non-conductive frame can include a via that extends from the first side to the second side of a non-metal portion of the housing. The via can be filled with a conductive material. The conductive material can be in contact with the first side of the metal bonding structure portion of the housing.

In one embodiment, the phase change material is configured to change phase between a liquid phase and a vapor phase, or between a solid phase and a liquid phase.

In one embodiment, the element includes an integrated device die or a heat sink.

In one aspect, a heat transfer element that is configured to be directly contacted to a metal surface of an element is disclosed. The heat transfer element includes a chamber that is defined at least in part by a housing that has a metal portion. The metal portion has a first side and a second side. The heat transfer element also includes a phase change material that is disposed in the chamber. The phase change material is in thermal communication with the first side of the metal portion.

In one embodiment, the metal portion includes a reactive metal.

In one embodiment, when the metal surface and the metal portion are brought into contact and an electrical current is applied, the metal portion is configured to bond with the metal surface of the element.

In one embodiment, the housing further has a non-metal portion that includes silicon.

In one embodiment, the metal portion has a thickness from the first side to the second side in a range of 20 µm to 50 µm. The metal portion can include aluminum layers and nickel layers that are alternatingly stacked.

In one embodiment, the housing further includes a spoke extending from a first non-metal wall of the housing.

In one aspect, a method of forming a heat transfer element is disclosed. The method includes depositing a metal bonding structure on a first surface of a non-conductive frame, and forming a cavity through a second surface of the non-conductive frame. The metal bonding structure is exposed to the cavity.

In one embodiment, the metal bonding structure includes a reactive metal bonding structure.

In one embodiment, the method further includes bonding a cap to the non-conductive frame to substantially seal the cavity.

In one embodiment, the method further includes filling the cavity with a phase change material.

In one embodiment, a method of forming a bonded structure is disclosed. The method includes providing a heat transfer element that is formed using the method if forming the heat transfer element. The method also includes directly contacting the heat transfer element to a second element. The method further includes bonding the heat transfer element and the second element.

BRIEF DESCRIPTION OF THE DRAWINGS

Embodiments of this disclosure will now be described, by way of non-limiting example, with reference to the accompanying drawings.

DETAILED DESCRIPTION

A heat transfer element or a heat sink can transfer heat generated by an electrical component (e.g., an integrated device die, a passive component such as an inductor, a resistor, and a capacitor, etc.) to the outside environs, thereby maintaining a temperature of the electrical component within a desired temperature range during operation of the electrical component. The heat transfer element can include a phase change material that changes phase (e.g., liquid to vapor or solid to liquid) in response to a difference (s) in temperature. The phase change material can provide relatively high heat transfer efficiency as compared to traditional heat sink devices.

Various embodiments disclosed herein relate to a heat transfer element. The heat transfer element can be thermally coupled to an element (e.g., an electrical component). The heat transfer element can spread heat generated by the electrical component. The heat transfer element and the electrical component can be bonded to define a bonded structure. The heat transfer element and the electrical component can be directly contacted to one another to provide an efficient thermal dissipation pathway for heat generated by the electrical component.

A heat transfer element according to various embodiments disclosed herein can include a chamber defined by a housing, and a phase change material disposed in the chamber. The heat transfer element can be coupled to an element by way of a metal bonding structure. The metal bonding structure can provide a direct contact bond between the heat transfer element and the element.

Figure 1A:
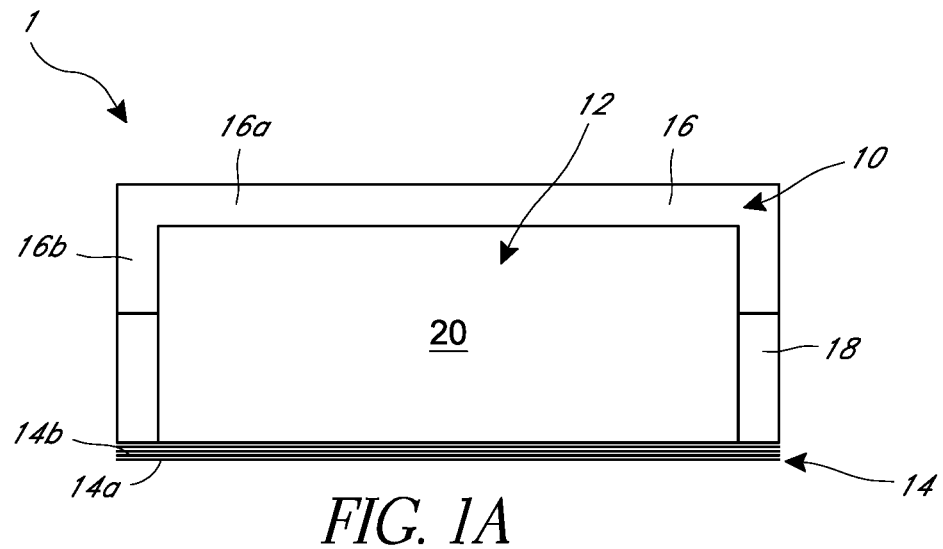
FIG. 1A is a schematic side cross-sectional view of a heat transfer element according to one embodiment.

FIG. 1A is a schematic side cross-sectional view of a heat transfer element 1 according to one embodiment. The heat transfer element 1 can comprise a housing 10 and a chamber 12 that is at least partially defined by the housing 10. The housing 10 can comprise a metal portion 14, an upper portion 16 and a lower portion 18 that mates or connects to the upper portion 16. In some embodiments, the housing 10 can provide a complete seal around the chamber 12 from the outside environs. In some embodiments, the chamber 12 can be in a vacuum or a near vacuum condition. The heat transfer element 1 can also include a phase change material 20 disposed in the chamber 12.

The metal portion 14 of the housing 10 can comprise any suitable metal. For example, the metal portion 14 can include a reactive metal that reacts to an application of energy (e.g., electrical energy or thermal energy). As illustrated in FIG. 1A, the metal portion 14 can comprise a stack of multiple metal layers, in some embodiments. For example, the stack can include a plurality of aluminum (Al) layers 14a and a plurality of nickel (Ni) layers 14b that are alternatingly stacked. In such embodiments, electrical current can be applied to the stack to react Al and Ni in the stack. After such a reaction, the metal portion 14 can define an aluminum-nickel (AlNi) alloy (see, for example, FIG. 1B). The metal portion after the reaction has occurred can be referred to as a metal bonding structure.

Each layer of the Al layers 14a and/or the Ni layers 14b can have a thickness of less than 20 nm, in some embodiments. For example the thickness of a layer of the metal stack can be in a range of 1 nm to 20 nm, in a range of 5 nm to 20 nm, or in a range of 5 nm to 15 nm. The stack of metal layers can have a thickness of less than 50 µm, in some embodiments. For example the thickness of the stack of metal layers can be in a range of 1 µm to 50 µm, in a range of 5 µm to 50 µm, in a range of 5 µm to 20 µm, or in a range of 20 µm to 50 µm.

In some embodiments, the metal portion 14 can define a bottom surface of the housing 10. In some embodiments, the metal portion 14 can cover more than fifty-percent (50%) of the bottom surface of the housing. For example, the metal portion 14 can cover the entirety of the bottom surface of the housing 10.

The upper portion 16 and the lower portion 18 of the housing 10 can comprise any suitable material. In some embodiments, the upper portion 16 and the lower portion 18 can comprise a nonconductive material, for example, a non-metallic material. For example, the upper portion 16 and the lower portion 18 can comprise silicon (Si). Using silicon for the upper portion 16 and the lower portion 18 can be beneficial. For example, silicon can provide relatively high thermal conductivity for the housing 10. Also, semiconductor wafer fabrication processes can be utilized to manufacture the upper portion 16 and the lower portion 18, thereby enabling relatively precise formation of the chamber 12 in the housing 10.

The upper portion 16 of the housing can comprise a base 16a and wall 16b that extends from the base 16a. As shown, the base 16a and wall 16b can cooperate to at least partially define a cavity. In some embodiments, the wall 16b of the upper portion 16 and the lower portion 18 can be bonded together by way of an adhesive, (e.g., hermetic adhesive). In some other embodiments, the upper portion 16 and the lower portion 18 can be bonded to each other in any other suitable manner.

The upper portion 16 and the lower portion 18 can at least partially define a frame of the housing 10. The frame can have a first side (a lower side) and a second side (an upper side) opposite the first side. In some embodiments, the upper side of the frame can define an upper side of the housing 10. The lower side of the frame can be in contact with the metal portion 14.

In some embodiments, the housing 10 can include a charge or inlet port (not illustrated) for providing the phase change material 20 into the chamber 12. For example, the upper portion 16 can comprise a seal, a plug, or a cap that seals the charge port. In some embodiments, the phase change material 20 can be in a liquid form when provided into the chamber 12. In such embodiments, the phase change material 20 can be, for example, injected into the chamber. In some other embodiments, the phase change material 20 can be in a solid form or in a vapor form. The phase change material 20 in the liquid form can change its phase to a solid form and/or a vapor form. The phase change material 20 in the solid form can change its phase to a liquid form and/or a vapor form. The phase change material 20 in the vapor form can change its phase to a solid form and/or a liquid form.

The phase change material 20 can comprise any suitable phase change material that can transfer heat. In some embodiments, the phase change material 20 can comprise water, methyl alcohol, ammonia, glycerin, etc.

In some embodiments, as illustrated in FIG. 1A, the metal portion 14 can be exposed to the chamber 12 and in contact with the phase change material 20. By having the metal portion 14 and the phase change material 20 in contact, a heat transfer performance between the metal portion 14 and the phase change material 20 can be relatively high as compared to a structure with an intervening layer between the metal portion 14 and the phase change material 20.

Figure 1B:
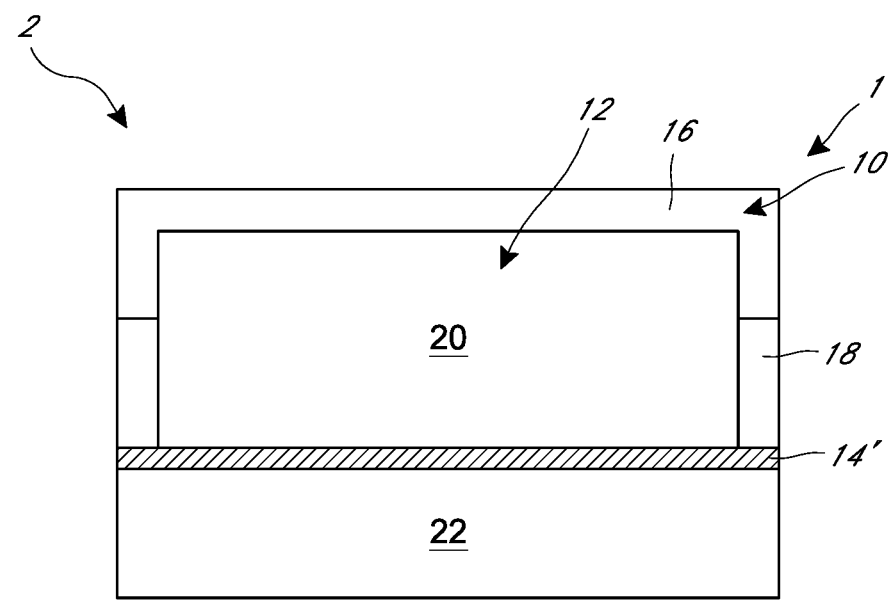
FIG. 1B is a schematic side cross-sectional view of a bonded structure that includes the heat transfer element of FIG. 1A, according to one embodiment.

FIG. 1B is a schematic side cross-sectional view of a bonded structure 2 that includes the heat transfer element 1 of FIG. 1A, according to one embodiment. The bonded structure 2 can include the heat transfer element 1 and an element (e.g., an electrical component 22). The heat transfer element 1 and the electrical component 22 are coupled by way of a metal bonding structure 14'.

The metal bonding structure 14' can comprise the metal portion 14 illustrated in FIG. 1A. The metal bonding structure 14' can also comprise a metal layer of the electrical component 22. In some embodiments, the metal portion 14 and the metal layer of the electrical component 22 can be directly contacted to at least partially define the metal bonding structure 14'. In some embodiments, the metal bonding structure 14' can comprise a metal alloy (e.g., an aluminum-nickel (AlNi) alloy).

In some embodiments, the metal portion 14 and the metal layer of the electrical component 22 can react to form the metal bonding structure 14', thereby bonding the heat transfer element 1 and the electrical component 22. In some embodiments, after stacking the heat transfer element 1 and the electrical component 22, energy (e.g., heat or electrical current) can be applied to the metal portion 14. In some embodiments, for example, an electric potential can be applied to the metal portion 14 to bond the heat transfer element 1 and the electrical component 22. For example, in other embodiments, the metal portion 14 can be exposed to a temperature in a range of about 200° C. to 300° C. The heat can be applied to the metal portion 14, rather than heating the entire bonded structure. This can mitigate or prevent the electrical component 22 from being excessively heated. In some embodiments, when the energy (e.g., electrical or thermal energy) is being applied, pressure can be applied to further enhance the bonding between the heat transfer element 1 and the electrical component 22.

The element (illustrated in FIG. 1B as the electrical component 22) can comprise any suitable electrical and/or non-electrical element. For example, the element can comprise an integrated device die, a passive component such as an inductor, a resistor, or capacitor, or a heat sink. In some applications, the bonded structure 2 can be coupled to a substrate or a device (not illustrated). For example, the bonded structure 2 can be mounted to a printed circuit board (PCB).

In some embodiments, heat transfer element 1 can configure to maintain a temperature of the electrical component 22 below a desired operating temperature. The phase change material 20 disposed in the chamber 12 can transfer or spread heat from the electrical component 22. The phase change material 20 can be highly thermally conductive. For example, the thermal conductivity of the phase change material 20 can be greater than the thermal conductivity of the electrical component 22. In some embodiments, heat generated by the electrical component 22 can conduct through the metal bonding structure 14' to the phase change material 20. The phase change material 20 can transfer or spread the heat in various directions, thereby mitigating or preventing the electrical component 22 from overheat.

Figure 2:
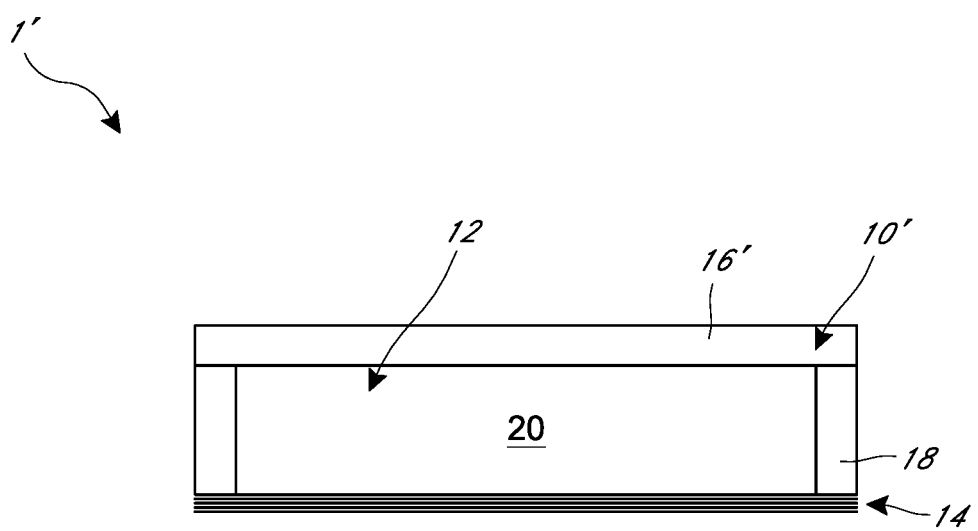
FIG. 2 is a schematic side cross-sectional view of a heat transfer element according to another embodiment.

FIG. 2 is a schematic side cross-sectional view of a heat transfer element 1' according to another embodiment. The heat transfer element 1' is generally similar to the heat transfer element 1 illustrated in FIG. 1A. Unless otherwise noted, components of FIG. 2 may refer to components that are the same as or generally similar to like components of FIGS. 1A and 1B. Unlike the upper portion 16 of the housing 10, the upper portion 16' of the housing 10' does not include the wall 16b. Rather, the upper portion 16 comprises a planar lid that can be bonded to the lower portion 18 to define the chamber 12.

Figure 3A:
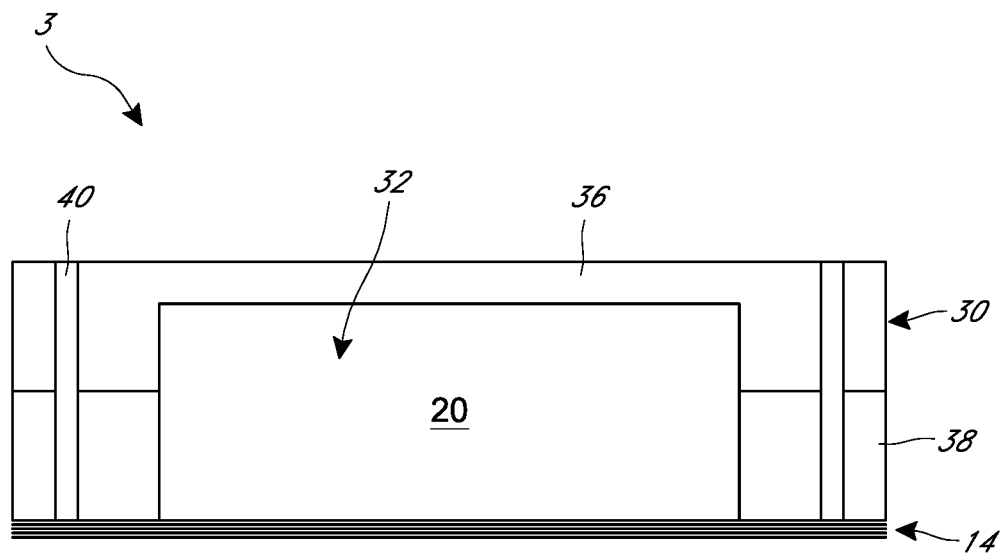
FIG. 3A is a schematic side cross-sectional view of a heat transfer element according to another embodiment.
Figure 3B:
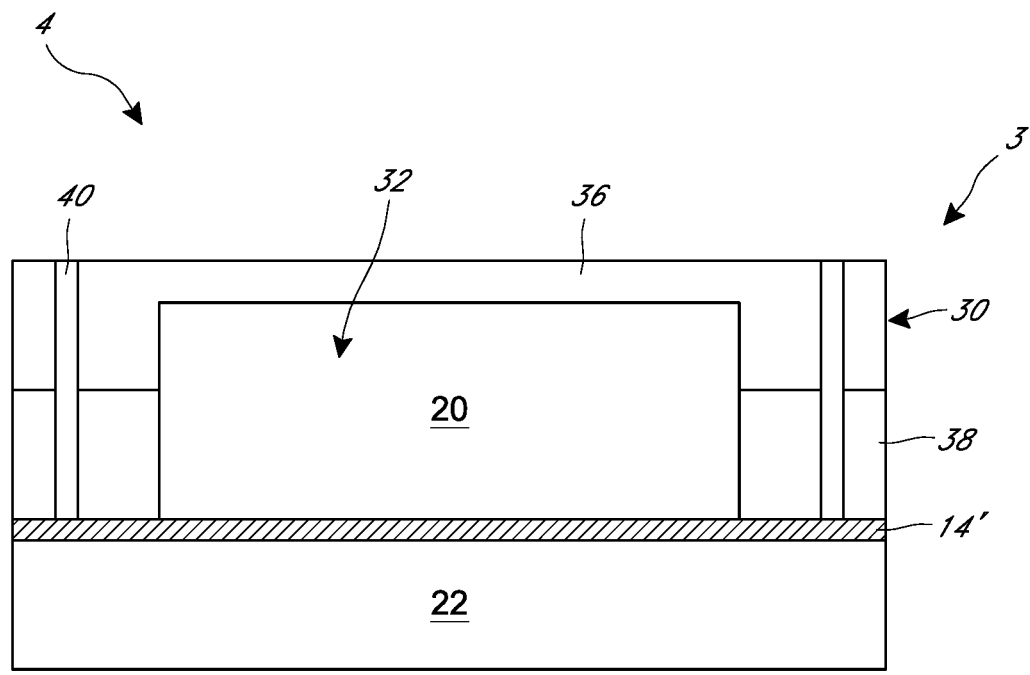
FIG. 3B is a schematic side cross-sectional view of a bonded structure that includes the heat transfer element of FIG. 3A.

FIG. 3A is a schematic side cross-sectional view of a heat transfer element 3 according to another embodiment. FIG. 3B is a schematic side cross-sectional view of a bonded structure 4 that includes the heat transfer element 3 of FIG. 3A. The heat transfer element 3 may be generally similar to the heat transfer element 1 illustrated in FIG. 1A. Unless otherwise noted, components of FIGS. 3A and 3B may refer to components that are the same as or generally similar to like components of FIGS. 1A and 1B.

The heat transfer element 3 can include a housing 30 that comprises an upper portion 36 and a lower portion 38, and a metal portion 14. The housing 30 and the metal portion 14 can at least partially define a chamber 32. The heat transfer element 3 can also include a phase change material 20 disposed in the chamber 32.

Unlike the housing 10 of the heat transfer element 10, the housing 30 of the heat transfer element 3 includes an electrical pathway (e.g., a filled via 40). The filled via 40 can comprise a conductive material (e.g., copper, aluminum, gold, etc.) disposed in a via formed vertically through the housing 10, e.g., through the upper and lower portions 36, 38. The conductive material can comprise any electrically and/or thermally conductive material. The filled via 40 can extend from an upper side of the housing 30 to a lower side of the housing 30. The filled via 40 can contact the metal portion 14 at the lower side of the housing 30. The filled via 40 can comprise a through silicon via (TSV) filled with a conductive material, in some embodiments. The filled via 40 can be electrically coupled to the metal portion 14 such that the filled via 40 provides an electrical pathway between the upper side of the housing 30 and the metal portion 14.

In FIG. 3B, the bonded structure 4 can include an element (e.g., an electrical component 22) that is coupled to the heat transfer element 3. The bonded structure 4 and the heat transfer element 3 can be bonded by way of the metal bonding structure 14'. In some embodiments, after contacting the metal portion 14 with the electrical component 22, the metal portion 14 can be reacted, for example, by way of application of electrical current, thereby bonding the heat transfer element 3 and the electrical component 22. After the reaction, the metal portion 14 can form the metal bonding structure 14' which can comprise an alloy of different metals. The electrical current can be applied through the via 40, for example, at the upper surface of the housing 30.

Figure 4A:
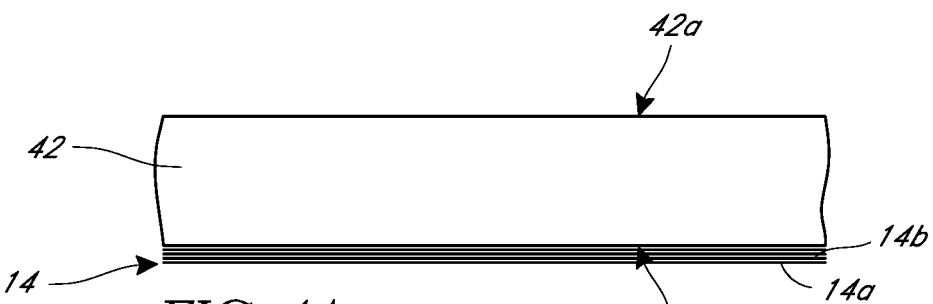
FIGS. 4A-4D show side cross-sectional views of a bonded structure during a process of manufacturing a bonded structure, according to one embodiment.

FIGS. 4A-4D show side cross-sectional views of a bonded structure during a process of manufacturing an example bonded structure according to one embodiment. FIG. 4A is a side cross sectional view of a portion of a wafer 42 and a metal structure (e.g., the metal portion 14). The wafer 42 has an upper side 42a and a lower side 42b opposite the upper side 42a. The metal portion 14 can be formed at the lower side 42b. In some embodiments, the wafer 42 can comprise a semiconductor wafer, such as a silicon wafer.

As explained above, the metal portion 14 can include a reactive metal that reacts to an application of energy (e.g., electrical energy or thermal energy). In some embodiments, the metal portion 14 can have a plurality of metal layers/films. For example, the metal portion 14 can include a plurality of aluminum (Al) layers 14a and a plurality of nickel (Ni) layers 14b that are alternately stacked.

Figure 4B:
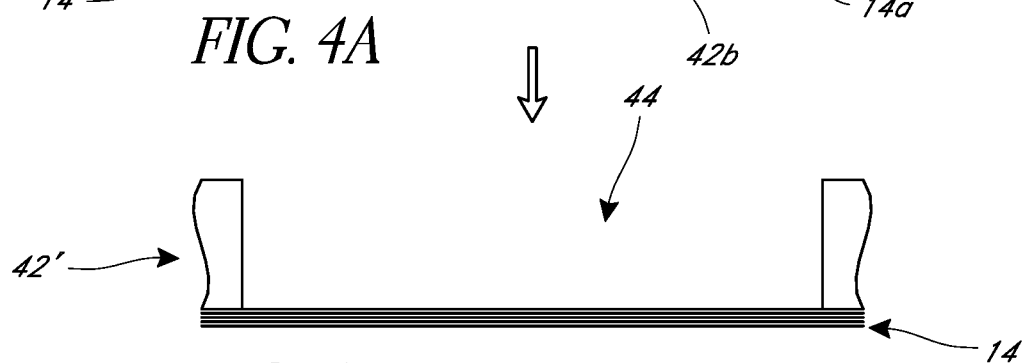

At least a portion of the wafer 42 of FIG. 4A can be removed by a removing process to define a cavity 44 illustrated in FIG. 4B. As illustrated in FIG. 4B, the cavity 44 can be defined at least in part by the metal portion 14 at a floor of the cavity 44 and portions 42' of the wafer that have not been removed. In some embodiments, an entire thickness of a portion of the wafer 42 can be removed to expose at least a portion of the metal portion 14.

FIG. 4B illustrates a portion of the wafer 42 illustrated in FIG. 4A. In some embodiments, numerous heat transfer elements (e.g., one hundred-fifty to three hundred in various embodiments heat transfer elements) can be manufactured from one wafer. Skilled artisans will appreciate that any suitable number of heat transfer elements may be formed from the wafer 42. Therefore, a plurality of cavities can be formed in the wafer 42.

The removing process can include any suitable process. For example, at least a portion of the wafer 42 can be removed from the upper side 42a of the wafer 42. In some embodiments, at least a portion of the wafer 42 can be removed by way of, for example, etching (e.g., wet etching or dry etching), or drilling (e.g., laser drilling). In some embodiments, an etchant can be selected based on the property of the metal portion 14, which can serve as an etch stop in some embodiments.

Figure 4C:
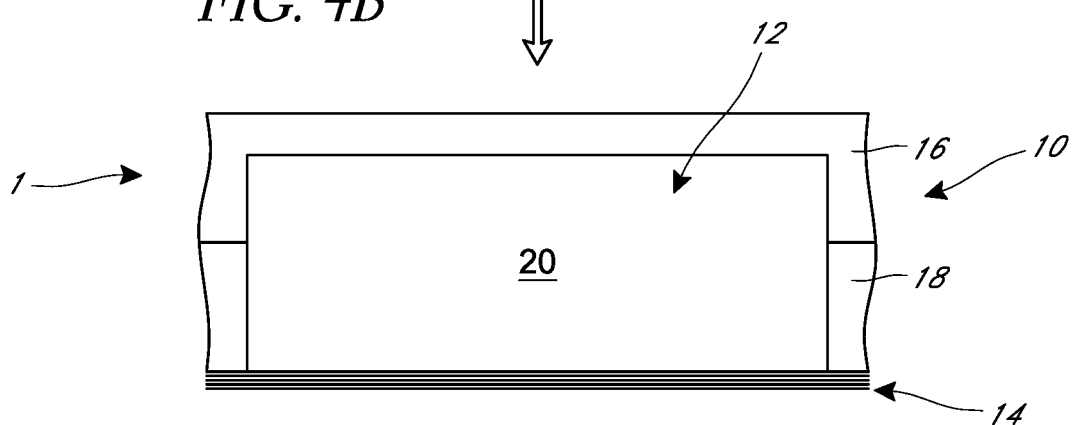

FIG. 4C shows a side cross-sectional view of the heat transfer element 1 before dicing. After the removing process, another wafer (e.g., which includes the upper portion 16) with another cavity is provided and coupled to the structure (e.g., the lower portion 18) formed in FIG. 4B, thereby defining a housing 10. In some embodiments, the upper portion 16 and the lower portion 18 can be bonded by way of an adhesive (e.g., a hermetic adhesive). The upper portion 16 and the lower portion 18 can be bonded in various suitable manners. A chamber 12 can be defined at least in part by the housing 10 (e.g., the metal portion 14, the upper portion 16, and a lower portion 18). In some embodiments, the wafer 42 can be diced to define a plurality of diced heat transfer elements including the heat transfer element 1. In a different process, the upper portion 16 and the lower portion 18 can be bonded after a dicing process. In other words, the upper portion 16 and the lower portion 18 can be bonded at die level.

A phase change material 20 can be disposed in the chamber 12. In some embodiments, the phase change material 20 can be disposed in the chamber 12 after the upper portion 16 and the lower portion 18 are bonded. In some embodiments, the housing 10 can include a charge or inlet port (not illustrated) for providing the phase change material 20 into the chamber 12. In some embodiments, the phase change material 20 can be in a liquid form when provided into the chamber 12. In such embodiments, the phase change material 20 can be, for example, injected into the chamber. In some other embodiments, the phase change material 20 can be in a solid form or in a vapor form.

Figure 4D:
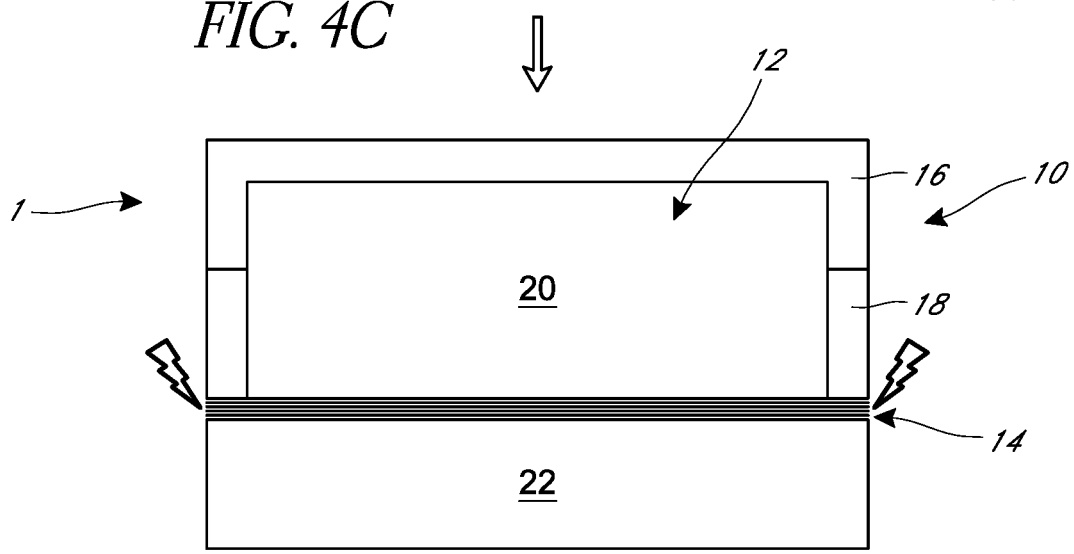

FIG. 4D shows a side cross-sectional view of the heat transfer element 1 that is in contact with and bonded to an element (e.g., an electrical component 22). As discussed above, the metal portion 14 of the heat transfer element can comprise a reactive metal, in some embodiments. In such embodiments, an application of energy (e.g., electrical energy or thermal energy) can cause the metal portion 14 to react to form a bond between the heat transfer element 1 and the electrical component 22. The energy can be applied from, for example, an edge of the metal portion 14, as illustrated in FIG. 4D. The application of energy can bond the electrical component 22 to the heat transfer element 1. In other embodiments, as explained above in connection with FIGS. 3A-3B, the energy can be applied to an upper surface of the housing and can be transferred to the metal portion 14 by way of the via 40.

Figure 5:
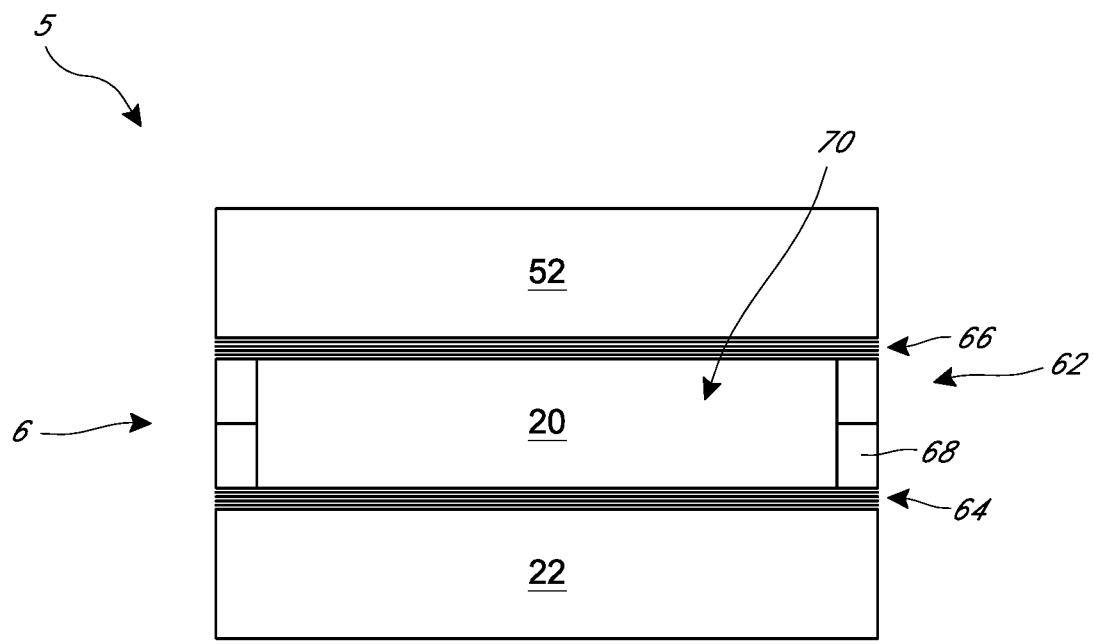
FIG. 5 is a schematic side cross-sectional view of a structure that includes a heat transfer element, according to one embodiment.

FIG. 5 is a schematic side cross-sectional view of a structure 5 that includes a heat transfer element 6 according to another embodiment. Unless otherwise noted, the components of FIG. 5 may refer to components that are the same as or generally similar to like components of FIGS. 1A to 4D. The structure 5 can include two elements (e.g., electrical components 22, 52) in contact with opposing sides of the heat transfer element 6.

The heat transfer element 6 can include a housing 62 that comprises a first metal portion 64, a second metal portion 66, and a frame 68. The heat transfer element 6 can also include a chamber 70 defined at least in part by the housing 62. A phase change material can be disposed in the chamber 70. As in FIGS. 1B and 3B, the electrical component 22 can be bonded to the heat transfer element 6 by way of a metal bonding structure 14'. Similarly, the electrical component 52 can be bonded to the heat transfer element 6 by way of a metal bonding structure 14'. Thus, in FIG. 5, heat can be vertically transferred between the electrical components 22, 52 by way of the heat transfer element 6.

Figure 6A:
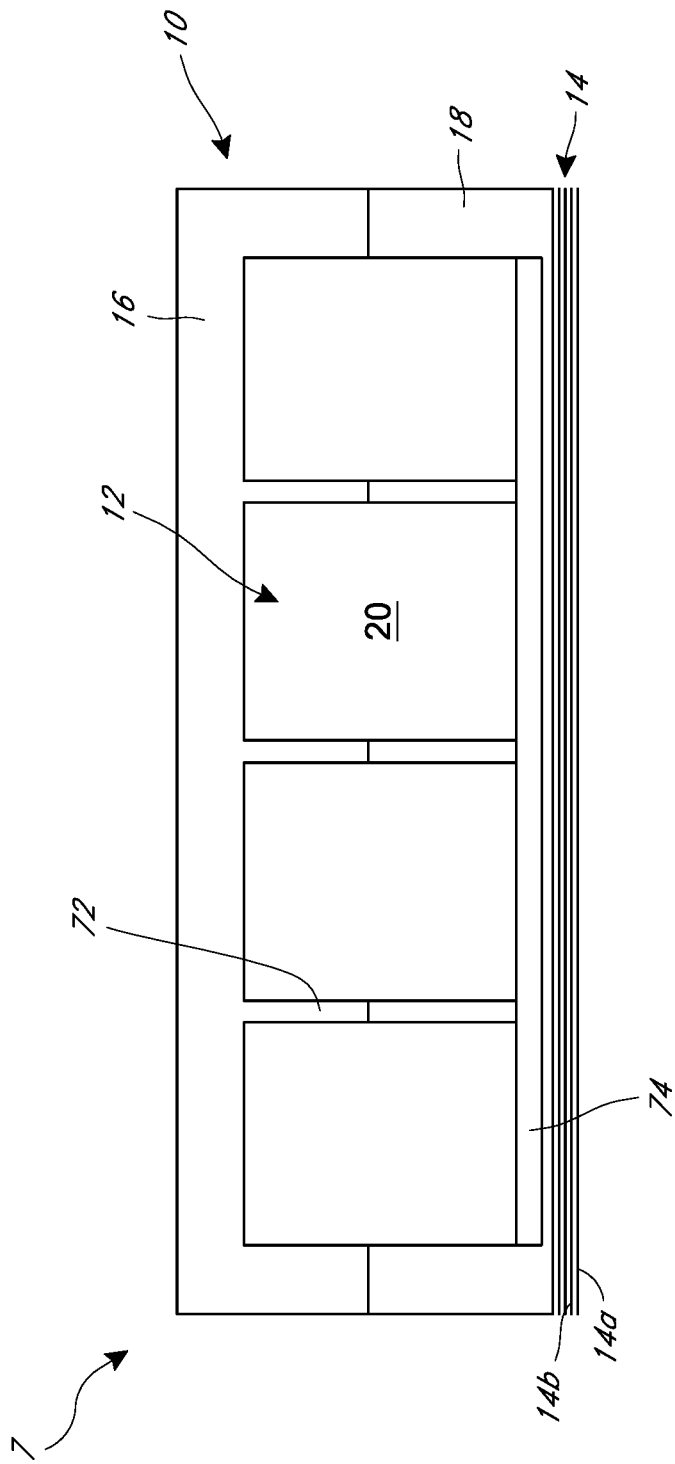
FIG. 6A is a schematic side cross-sectional view of a heat transfer element according to another embodiment.
Figure 6B:
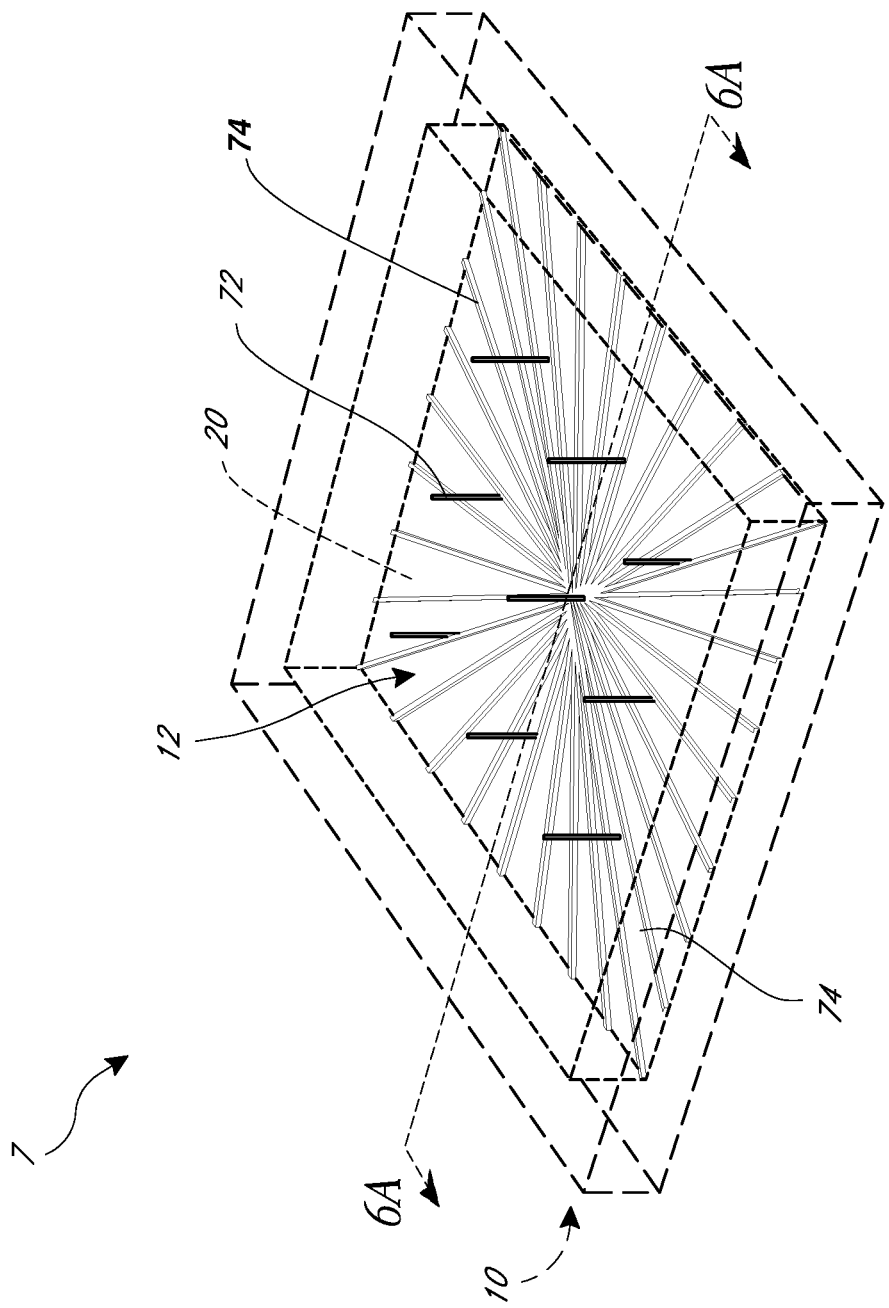
FIG. 6B is a schematic perspective view of the heat transfer element of FIG. 6A.

FIG. 6A is a schematic side cross-sectional view of a heat transfer element 7 according to another embodiment. FIG. 6B is a schematic perspective view of the heat transfer element 7. The heat transfer element 7 is generally similar to the heat transfer element 1 illustrated in FIG. 1A. Unless otherwise noted, components of FIGS. 6A and 6B may refer to components that are the same as or generally similar to like components of FIG. 1A.

The heat transfer element 7 can include a housing 10 that comprises a frame and a metal portion 14. The heat transfer element 7 can include a chamber 12 that is defined at least in part by the housing 10. The frame can comprise an upper portion 16 and a lower portion 18. The heat transfer element 7 can also include a pillar 72 and a spoke 74. In some embodiments, the pillar 72 can extend from the spoke 74. The pillar 72 and the spoke 74 can extend nonparallel to each other. For example, the pillar 72 and the spoke 74 can extend generally perpendicular to each other. In some embodiments, the spoke 74 can extend from a section of the frame. In some embodiments, the spoke 74 can contact the metal portion 14.

The pillar 72 and/or the spoke 74 can be formed using any suitable process. For example, the pillar 72 and/or the spoke 74 can be formed when a portion of the wafer 42 is removed to form the cavity 44 in a removing process as shown in FIG. 4B. For example, the pillar 72 and/or the spoke 74 can be formed after the cavity 44 is formed in some embodiments. In some embodiments, the pillar 72 can be formed with any suitable method such as masked etching. In some embodiments, the spoke 74 can be formed prior to forming the cavity 44 (see FIG. 4B) from the lower side 42b of the wafer 42. For example, the spoke 74 can comprise a layer deposited on the lower side 42b, which can be an etch stop when back etching the wafer 42.

A pressure in the chamber 12 and a pressure of the outside environs can be different. For example, when the chamber 12 is in a vacuum or near vacuum condition, certain portions of the housing 10 may deform or be subject to mechanical stresses. In such condition, the pillar 72 and/or the spoke 74 can provide mechanical support to the heat transfer element 7, thereby mitigating and/or preventing the heat transfer element 7 from a structural failure.

In some embodiments, as described above, the phase change material 20 can be in a liquid form, a solid form, and/or a vapor form. For example, the phase change material 20 can change its phase from the liquid form to the vapor form in response to an increase in temperature. In some embodiments, a heat transfer element with the pillar 72 can enable the vapor form of the phase change material 20 to change back to the liquid form more quickly than a heat transfer element without the pillars 72. For example, the pillar 72 can wick the vapor form of the phase change material 20 down to a lower side of the heat transfer element 7 to relatively quickly return to the liquid form.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A heat transfer element configured to be directly contacted to a metal surface of an element, the heat transfer element comprising:
    a chamber defined at least in part by a housing having an electrically non-conductive frame and a metal portion,
        wherein the non-conductive frame comprises a base and a sidewall extending downwardly from the base, and
        wherein the metal portion has a first side and a second side and is positioned between the element and the chamber and between the element and the sidewall of the electrically non-conductive frame, the metal portion separating the element and the chamber,
    wherein the sidewall of the housing extends directly and upwardly from the first side of the metal portion and is disposed above the element; and
    a phase change material disposed in the chamber, the phase change material being in thermal communication with the first side of the metal portion,
    wherein the metal portion comprises at least two electrically reactive, alloy forming metals configured to, when the metal surface and the metal portion are brought into contact and an electrical current is applied, form an alloy and bond with the metal surface of the element.

2. The heat transfer element of claim 1, wherein an edge of the metal portion is accessible for application of electrical current.

3. The heat transfer element of claim 1, wherein the metal portion comprises a plurality of alternated first metal layers and a plurality of second metal layers.

4. The heat transfer element of claim 1, wherein the housing further has a non-metal portion that comprises silicon.

5. The heat transfer element of claim 1, wherein the metal portion has a thickness from the first side to the second side in a range of 20 μm to 50 μm.

6. The heat transfer element of claim 5, wherein the metal portion comprises aluminum layers and nickel layers alternatingly stacked.

7. The heat transfer element of claim 1, wherein the housing further comprises a spoke extending from the sidewall of the non-conductive frame of the housing.

* * * * *